US012665587B2

(12) United States Patent
Zamprogno et al.

(10) Patent No.: US 12,665,587 B2
(45) Date of Patent: Jun. 23, 2026

(54) HIGH-VOLTAGE BIDIRECTIONAL SWITCH DEVICE WITH IMPROVED ELECTRICAL CHARACTERISTICS

(71) Applicant: STMicroelectronics International N.V., Geneva (CH)

(72) Inventors: Marco Zamprogno, Cesano Maderno (IT); Pasquale Flora, Varese (IT); Fabio Severini, Orzinuovi (IT)

(73) Assignee: STMicroelectronics International N.V., Geneva (CH)

( * ) Notice: Subject to any disclaimer, the term of this patent is extended or adjusted under 35 U.S.C. 154(b) by 59 days.

(21) Appl. No.: 18/740,272

(22) Filed: Jun. 11, 2024

(65) Prior Publication Data

US 2024/0421809 A1 Dec. 19, 2024

(30) Foreign Application Priority Data

Jun. 19, 2023 (IT) ........................ 102023000012555

(51) Int. Cl.
*H03K 17/04* (2006.01)
*H03K 17/041* (2006.01)
(52) U.S. Cl.
CPC .............................. *H03K 17/04106* (2013.01)
(58) Field of Classification Search
CPC ............................................... H03K 17/04106
See application file for complete search history.

(56) References Cited

U.S. PATENT DOCUMENTS

| | | | |
|---|---|---|---|
| 10,277,205 B1 * | 4/2019 | Tripathi | ................... H03F 3/19 |
| 11,146,267 B1 * | 10/2021 | Consiglieri | ........ H03K 17/6871 |
| 11,581,892 B2 | 2/2023 | Zamprogno | |
| 2007/0273427 A1 * | 11/2007 | Ricotti | .............. H03K 17/6874 |
| | | | 327/427 |
| 2016/0043720 A1 | 2/2016 | Kubota et al. | |
| 2020/0052607 A1 * | 2/2020 | Telefus | ................... H02M 1/08 |

FOREIGN PATENT DOCUMENTS

| | | | |
|---|---|---|---|
| EP | 1860775 A1 | 11/2007 | |
| JP | 2011097637 A | * 5/2011 | |

* cited by examiner

*Primary Examiner* — Daniel C Puentes
(74) *Attorney, Agent, or Firm* — Seed Intellectual Property Law Group LLP

(57) ABSTRACT

A switch device is described, formed by: a first switch MOS transistor, with its drain terminal connected to a first switch terminal, source terminal connected to an internal source node and gate terminal connected to an internal gate node; a second switch MOS transistor, with its drain terminal connected to a second switch terminal, source terminal connected to the internal source node and gate terminal connected to the internal gate node; and a voltage limiting element connected between the internal gate and source nodes. A driving stage, voltage-referred to the internal source node, drives the switching of the bidirectional switch, as a function a first and a second driving signals, and has a driving transistor and a switching transistor connected to each other in inverter configuration.

20 Claims, 7 Drawing Sheets

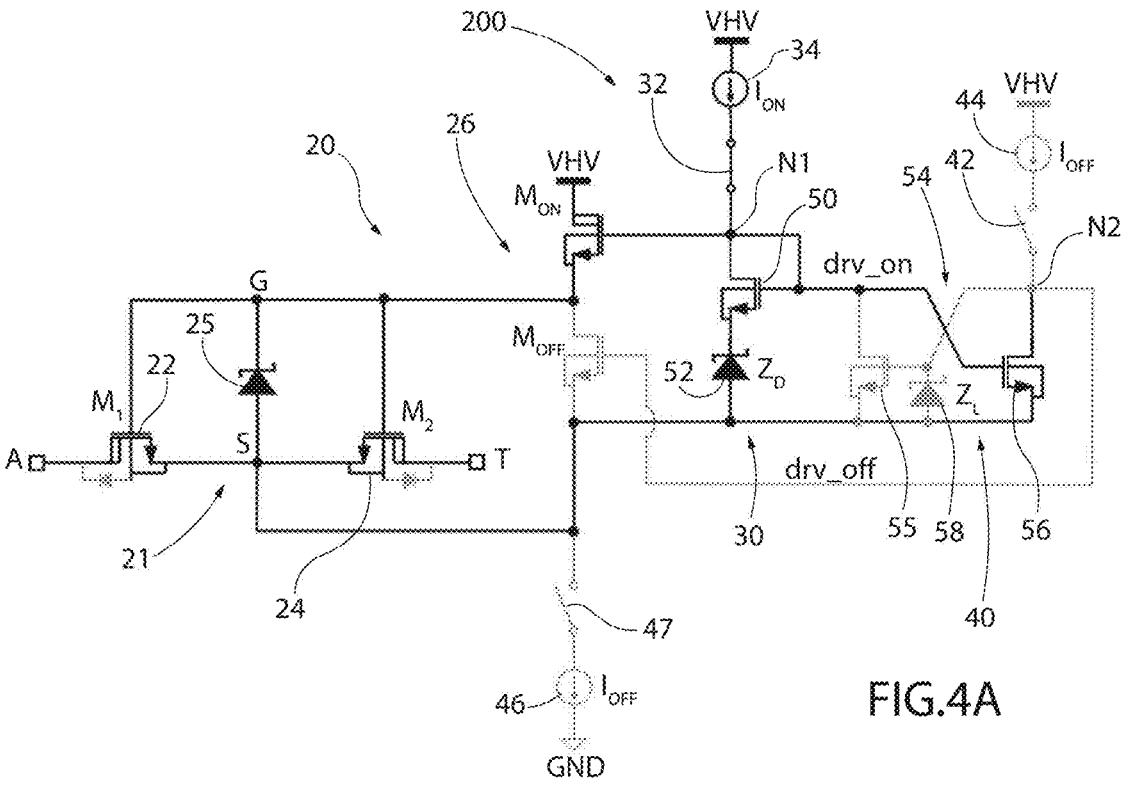
FIG.4A
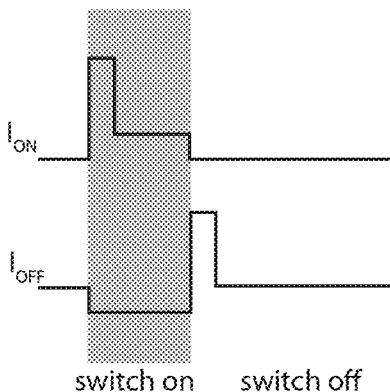
switch on    switch off    FIG.4B switch on     switch off

HIGH-VOLTAGE BIDIRECTIONAL SWITCH DEVICE WITH IMPROVED ELECTRICAL CHARACTERISTICS

BACKGROUND

Technical Field

The present solution relates to a high-voltage bidirectional switch device with improved electrical characteristics.

Description of the Related Art

There are several applications in which it is beneficial to use bidirectional high-voltage switch devices, capable of allowing the transfer of current in both directions between a first high-voltage terminal and a second high-voltage terminal.

By way of example, high-voltage switch devices are commonly used in charge recovery resonant drivers.

These drivers base the charge recovery on a suitable sharing between a first and a second load capacitive elements (which may correspond to capacitive actuators, for example capacitive micromirrors) by using a certain number of tank and storage capacitors.

In particular, the sharing of charge between the capacitive elements is achieved according to a specific charge recovery algorithm by means of bidirectional switch devices connected between the same capacitive elements and the storage capacitors, suitably driven by driving signals having a high-voltage (of the order of several tens of V) and average frequencies (up to a few tens of kHz).

These switch devices are utilized to manage (bidirectionally) high voltages on both terminals. In particular, to exploit the charge recovery performances, switch devices not only have low on-state resistance, but also have fast turn-on and turn-off times. Furthermore, the energy consumption to drive the switches and the area utilized to form the corresponding drivers typically need to be minimized.

FIG. 1 shows a known circuit embodiment of a high-voltage bidirectional switch device, generally indicated by 1.

This switch device 1 defines a bidirectional switch formed by: a first switch element 2, in particular a high-voltage MOS transistor M1, having drain terminal connected to a first switch terminal A (e.g., designed to be connected to a first charge redistribution capacitive element), source terminal connected to an internal node S and gate terminal connected to an internal node G. The bulk terminal of the MOS transistor M1 is also connected to the source terminal, in such a way that the parasitic diode (indicated in FIG. 1) is directed to avoid improper turn-on during operation (in some cases, the connection between bulk and source terminals is intrinsic).

The bidirectional switch is also formed by a second switch element 4, in particular a high-voltage MOS transistor M2, having drain terminal connected to a second switch terminal T (e.g., designed to be connected to a second charge redistribution capacitive element), source terminal connected to the internal node S and gate terminal connected to the internal node G. As shown in FIG. 1, the MOS transistor M2 also has a bulk terminal connected to the source terminal, as previously discussed.

The aforementioned high-voltage MOS transistors M1, M2 are capable of withstanding high voltages applied between the corresponding drain and source terminals and between the corresponding gate and drain terminals (e.g., with values of the order of 40-60 V).

The switch device 1 also includes a voltage limiting element 5 connected between the internal nodes G and S, in particular formed by a zener diode, having anode connected to the aforementioned internal node S and cathode connected to the aforementioned internal node G, and having the function of limiting the voltage between the same internal nodes G and S to a maximum value, for example equal to 5.5 V (that may be withstood between the gate and source terminals by the aforementioned MOS transistors M1, M2).

The switch device 1 also includes: a first current generator 6, configured to generate a first current I1, connected between a supply terminal having a high supply voltage VHV (e.g., of the order of 40-60 V) and the internal node G, with the interposition of a first switch 7; a second current generator 8, configured to generate a second current I2, connected between the internal node S, with the interposition of a second switch 9, and a ground reference (GND); and furthermore a third switch 10, interposed between the aforementioned internal node G and the ground reference GND.

Operation of the switch device 1 envisages that the same switch device 1 is turned on by providing the first and second currents I1 and I2 by closing the first and second switches 7, 9, with the aforementioned voltage limiting element 5 which defines and limits the voltage VGS between gate and source for the MOS transistors M1 and M2; consequently, a current transfer occurs between the first and the second switch terminals A, T (possible in both directions).

The switch device 1 is turned off removing the first and second currents I1 and I2 by opening the first and second switches 7, 9 and also connecting the internal node G (and therefore the gate terminal of the MOS transistors M1 and M2) to the ground reference GND, by closing the third switch 10 (in a manner not illustrated here, the possibility of connecting also the internal node S and therefore the source terminal of the same MOS transistors M1 and M2 to the ground reference GND may also be envisaged); consequently, the current transfer between the first and the second switch terminals A, T is interrupted.

However, this switch device 1 has some drawbacks.

In the first place, when the switch device 1 is off, the parasitic capacitances at the internal nodes G and S are totally discharged to the ground reference, so that the same capacitances are recharged each time, upon turn-on (with an associated increase in current consumption).

Furthermore, the turn-on currents (the aforementioned first and second currents I1 and I2) have a high value to ensure sufficiently rapid charging times; the circuit designed for their generation is therefore generally complex, has costly manufacture and entails high area occupation in integrated manufacturing.

Furthermore, these turn-on currents are applied for a time which is not known a priori and is variable as a function of parameters such as the process, voltages to be controlled and temperature; the value of these currents is therefore generally oversized to avoid operating issues.

The aforementioned issues are accentuated by the fact that the switch device is has (as previously mentioned) an on-resistance value that is as low as possible in order to maximize the efficiency (for example of an associated charge recovery driver). This may be obtained by increasing its size and (especially in high-voltage domains) this entails a significant increase in parasitic capacitances.

Some solutions have therefore been proposed aimed at overcoming, at least in part, the issues described above for the switch device 1.

For example, it has been proposed to limit the application of the turn-on currents only for a short time interval (of initial precharge), at turn-on, followed by a lower holding current. Furthermore, the use of auxiliary switch elements, transistor switch elements, has been proposed, in addition to the aforementioned MOS transistors M1 and M2, also operative in an initial precharge phase.

However, despite being capable of allowing a reduction in the turn-on times, these solutions generally entail greater complexity and higher power consumption and, in any case, do not overcome some of the issues previously highlighted.

BRIEF SUMMARY

Embodiments of the present disclosure overcome, at least in part, the issues previously highlighted.

In one embodiment, a switch device includes a bidirectional switch. The bidirectional switch includes a first switch MOS transistor, having a drain terminal connected to a first switch terminal, a source terminal connected to an internal source node and a gate terminal connected to an internal gate node. The bidirectional switch includes a second switch MOS transistor, having a drain terminal connected to a second switch terminal, a source terminal connected to the internal source node and a gate terminal connected to the internal gate node. The bidirectional switch includes a voltage limiting element connected between the internal gate and source nodes. The switch device includes a driving stage voltage-referred to the internal source node and configured to drive switching of the bidirectional switch as a function of a first driving signal and a second driving signal, the driving stage including a driving transistor and a switching transistor connected to each other. The driving transistor is connected to a supply terminal and is driven by the first driving signal to charge the internal gate node and turn on the bidirectional switch in a turn-on interval of the switch device. The switching transistor is driven by the second driving signal to short-circuit the internal gate and source nodes and turn off the bidirectional switch in a turn-off interval of the switch device.

In one embodiment, a charge recovery resonant driver includes a first capacitive actuator, coupled to a first charge exchange terminal selectively alternately connectable to a supply terminal having a high voltage and a ground reference terminal and a second capacitive actuator, coupled to a second charge exchange terminal selectively alternately connectable to the supply terminal and the ground reference terminal. The charge recovery resonant driver includes a plurality of tank capacitors each coupled to a respective pair of devices and selectively connectable to the first charge exchange device by a first switch device of the pair and to the second charge exchange terminal by a second switch device of the pair. Each switch device includes a bidirectional switch having a first switch MOS transistor having a drain terminal connected to a first switch terminal, a source terminal connected to an internal source node, and a gate terminal connected to an internal gate node and a second switch MOS transistor having a drain terminal connected to a second switch terminal, a source terminal connected to the internal source node and a gate terminal connected to the internal gate node. The bidirectional switch includes a voltage limiting element connected between the internal gate and source nodes. Each switch device includes a driving stage voltage-referred to the internal source node and configured to drive switching of the bidirectional switch as a function of a first driving signal and a second driving signal, the driving stage including a driving transistor and a switching transistor connected to each other.

In one embodiment, a method includes driving a bidirectional switch of a switch device with a driving stage based on a first driving signal and a second driving signal. The driving stage includes a driving transistor and a switching transistor connected to each other. The bidirectional switch includes a first switch MOS transistor and a second switch MOS transistor coupled together between a first switch terminal and a second switch terminal at an internal source node. The bidirectional switch includes an internal gate coupled to the internal source by a voltage limiting device, to gate terminals of the first and switch MOS transistors, and to an output of the driving stage. The method includes providing a supply voltage to a drain terminal of the driving transistor, charging the internal gate node and turning on the bidirectional switch in a turn-on interval of the switch device by driving the driving transistor with the first driving signal, and short-circuiting the internal gate and source nodes and turning off the bidirectional switch in a turn-off interval of the switch device by driving the switching transistor with the second driving signal.

BRIEF DESCRIPTION OF THE SEVERAL VIEWS OF THE DRAWINGS

For a better understanding of the present invention, a preferred embodiment thereof is now described, purely by way of non-limiting example and with reference to the attached drawings, wherein:

FIG. 4A shows the bidirectional switch device of FIG. 3, with particular reference to a turn-on phase;

FIG. 4B shows a time diagram of turn-on and turn-off currents in the switch device, with particular reference to the aforementioned turn-on phase;

DETAILED DESCRIPTION

Figure 2:
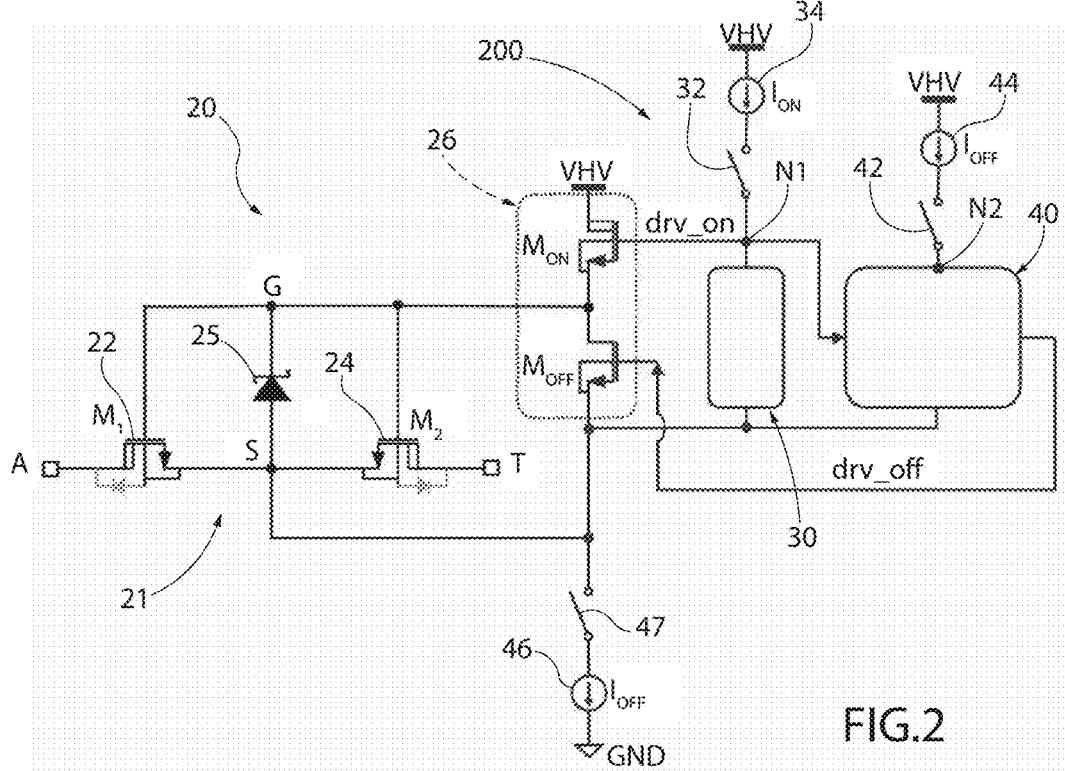
FIG. 2 shows the circuit diagram of a high-voltage bidirectional switch device, according to an embodiment of the present solution.

FIG. 2 shows a high-voltage bidirectional switch device, generally indicated by 20, according to the present solution.

The switch device 20 includes a bidirectional switch 21, which is formed, in a substantially analogous manner to what discussed with reference to FIG. 1, by:

a first switch element 22, in particular a high-voltage MOS transistor M1, having drain terminal connected to a first switch terminal A (e.g., designed to be connected to a first capacitive element, for example to a capacitive actuator), source terminal connected to an internal node S and gate terminal connected to an internal node G;

a second switch element 24, in particular a high-voltage MOS transistor M2, having drain terminal connected to a second switch terminal T (e.g., designed to be connected to a second capacitive element, in particular to a storage capacitor), source terminal connected to the internal node S and gate terminal connected to the internal node G; and a voltage limiting element 25 connected between the internal nodes G and S, in particular formed by a zener diode, having anode connected to the aforementioned internal node S and cathode connected to the aforementioned internal node G, and having the function of limiting the voltage between the same internal nodes G and S to a maximum withstandable value, for example equal to 5.5 V.

The aforementioned high-voltage MOS transistors M1, M2 are capable of withstanding high voltages applied between the corresponding drain and source terminals and between the corresponding gate and drain terminals (for example, of the order of 40-60 V); the voltage between the gate and source terminals is instead limited to the maximum value clamped by the aforementioned voltage limiting element 25.

According to an aspect of the present solution, the switch device 20 further includes a control and driving stage, generally indicated by 200, voltage-referred to the internal node S (as opposed to a ground reference GND) and configured to control and drive switching of the bidirectional switch 21.

This control and driving stage 200 includes a driving stage 26, referred to the internal node S and configured to receive at an input first and a second driving signals drv_on, drv_off, both voltage signals (with logically opposite values, i.e., if drv_on is logically high then drv_off is logically low and vice versa), and implement the switching of the bidirectional switch 21 as a function of these first and second driving signals drv_on, drv_off.

In detail, the driving stage 26 includes a driving transistor $M_{ON}$ and a switching transistor $M_{OFF}$, both of NMOS-type, driven by the aforementioned first and second driving signals drv_on, drv_off and connected to each other in inverter configuration.

In particular, the driving transistor $M_{ON}$ has its drain terminal connected to a supply terminal having a high supply voltage VHV (e.g., of the order of 40-60 V), gate terminal which receives the first driving signal drv_on and source terminal connected to the aforementioned internal node G (furthermore, the source terminal is connected to the corresponding bulk terminal, for correctly biasing the junctions in each operating condition).

The switching transistor $M_{OFF}$ has its drain terminal connected to the aforementioned internal node G, gate terminal which receives the second driving signal drv_off and source terminal connected to the aforementioned internal node S (the source terminal is also connected to the corresponding bulk terminal).

In greater detail, the driving transistor $M_{ON}$ is in source-follower configuration and is driven by the first driving signal drv_on to charge the internal node G (and therefore the gate terminals of the MOS transistors M1 and M2) in a fast and efficient manner and thereby turn on the bidirectional switch 21 (allowing the current or charge transfer between the corresponding terminals A and T, in both directions); this configuration is also advantageously self-limited in current.

The switching transistor $M_{OFF}$ is driven by the second driving signal drv_off to short-circuit, when driven in the on-state, the internal nodes G and S (and therefore the gate and source terminals of the MOS transistors M1 and M2), thereby turning off the bidirectional switch 21 (it should be noted that, unlike known solutions, the gate and/or source terminals of the same MOS transistors M1 and M2 are not connected in this case to the ground reference GND during operation of the switch device 20, in particular for turning off the bidirectional switch 21).

The control and driving stage 200 of the switch device 20 further includes a load stage 30, also referred to the internal node S and having an input terminal N1 selectively connectable, by a first switch 32, to a turn-on current generator 34, configured to generate a turn-on current $I_{ON}$ and in turn connected to the supply terminal (and to the high voltage VHV).

The aforementioned load stage 30 is configured to generate, through the turn-on current $I_{ON}$, the first driving signal drv_on, being a voltage signal, to cause turn-on of the driving transistor $M_{ON}$ of the driving stage 26.

The control and driving stage 200 of the switch device 20 also includes a switching logic stage 40, also referred to the internal node S and having a respective input terminal N2 selectively connectable, by a second switch 42, to a turn-off current generator 44, configured to generate a turn-off current $I_{OFF}$ and in turn connected to the supply terminal (and to the high voltage VHV).

This switching logic stage 40 is configured to generate, on the basis of the turn-off current $I_{OFF}$ and the value of the first driving signal drv_on, the second driving signal drv_off, being a voltage signal, to cause turn-on of the switching transistor $M_{OFF}$ of the driving stage 26.

As will also be discussed in detail hereinbelow, the second driving signal drv_off which (when logically high) allows the switching transistor $M_{OFF}$ to be turned on is generated by the turn-off current $I_{OFF}$ and by switching of the first driving signal drv_on to the low logic value, in turn generated by turning off the turn-on current $I_{ON}$. The driving signals drv_on, drv_off which determine turn-on and turn-off of the turn-on and switching transistors $M_{ON}$ and $M_{OFF}$ are therefore controlled by the turn-on and turn-off currents $I_{ON}$ and $I_{OFF}$ (in turn determined by the activation, logically alternative, of the corresponding switches 32, 42). Substantially, when it is desired to switch on the turn-on transistor $M_{ON}$, the turn-on current $I_{ON}$ is activated and the turn-off current $I_{OFF}$ is deactivated; consequently, the first driving signal drv_on goes to the high logic state and the second driving signal drv_off to the low logic state. Conversely, when it is desired to switch on the turn-off transistor $M_{OFF}$, the turn-off current $I_{OFF}$ is activated and the turn-on current $I_{ON}$ is deactivated; consequently, the second driving signal drv_off goes to the high logic state and the first driving signal drv_on to the low logic state.

The aforementioned control and driving stage 200 may also comprise, as shown in the aforementioned FIG. 2, a further turn-off current generator 46, configured to generate the turn-off current $I_{OFF}$ and connectable between the internal node S (by a third switch 47) and the ground reference GND. As will also be discussed hereinbelow, this further turn-off current generator 46, if present, is configured to compensate for the turn-off current $I_{OFF}$ used by the aforementioned switching logic stage 40.

During operation, the driving stage 26 behaves like an N-type inverter, referred to the internal node S, thus operating in a floating manner with respect to the ground reference GND.

Turn-on utilizes a small value of the turn-on current $I_{ON}$ (since this current only needs to charge the parasitic capacitance of the turn-on transistor $M_{ON}$ and of the load), which determines the generation, by the load stage 30, of a suitable value of the first driving signal drv_on, such as to cause turn-on of the driving transistor $M_{ON}$ of the driving stage 26.

The turn-off is obtained by short-circuiting the source and gate terminals of the MOS transistors M1 and M2, as opposed to bringing (as in known solutions) the same terminals to the ground reference GND. In turn-off state, both the first switch element 22 and the second switch element 24 remain in a totally floating state, thus following the dynamics of the capacitive elements connected to the switch terminals A and T. Substantially, the parasitic capacitances are therefore not completely discharged towards ground, but undergo at most a limited discharge, corresponding to the loss of voltage between gate and source ($V_{GS}$), due to turn-off of the aforementioned transistors M1 and M2.

It should be noted that, in a manner not illustrated in detail (but which will be evident to a person skilled in the art), the aforementioned switch device 20 is configured to receive from the outside (e.g. from a control unit of an electronic device wherein the same switch device 20 is used) suitable control signals, in particular for driving the first, second and third switches 32, 42, 47, for timing of the aforementioned turn-on and turn-off phases of the switch device 20 (as previously discussed).

Figure 3:
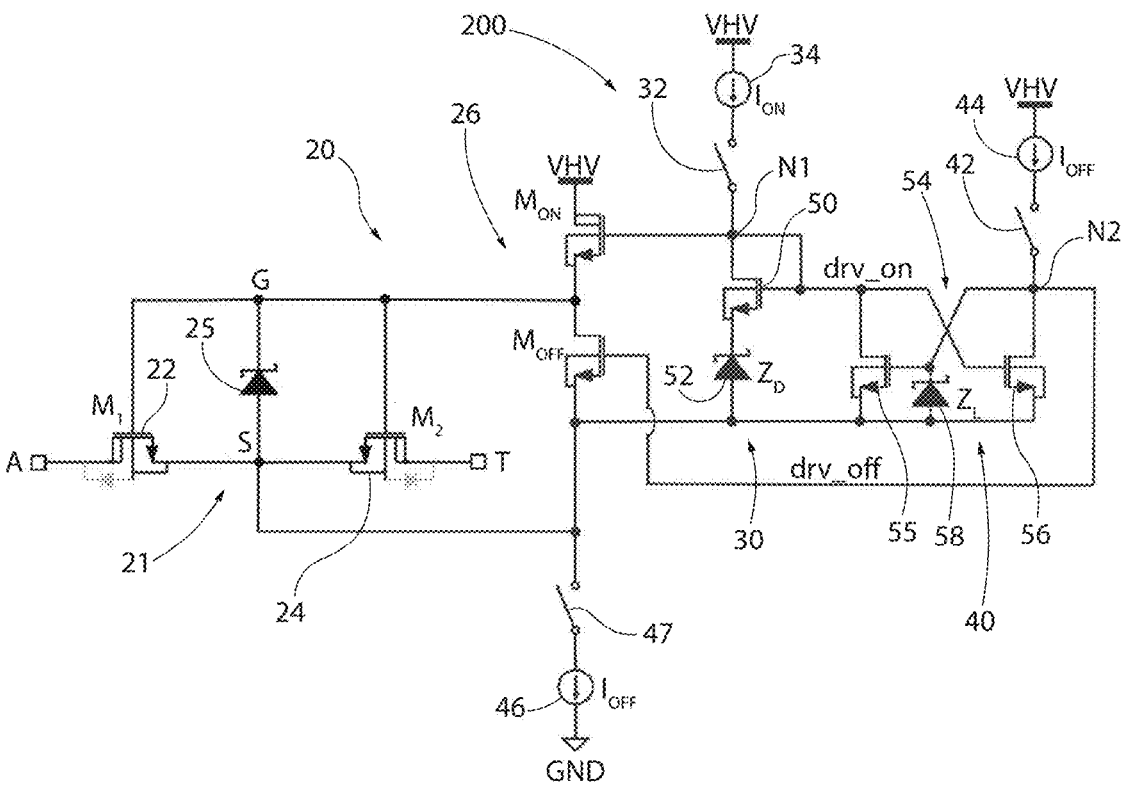
FIG. 3 shows a more detailed circuit diagram of the bidirectional switch device of FIG. 2.

Referring now to FIG. 3, a first embodiment of the control and driving stage 200 of the switch device 20 is now described in greater detail, in particular with respect to the aforementioned load stage 30 and the aforementioned switching logic stage 40.

In the illustrated embodiment, the load stage 30 includes a load transistor 50, of low-voltage NMOS-type, and a load zener diode 52, connected in series with the load transistor 50, having anode terminal connected to the internal node S and cathode terminal connected to the source terminal of the aforementioned load transistor 50. This load transistor 50 also has gate terminal connected to the corresponding drain terminal (being therefore diode-connected) and also to the input terminal N1 of the load stage 30, i.e., to the gate terminal of the driving transistor $M_{ON}$ of the driving stage 26, at which the first driving signal drv_on is generated (the aforementioned load transistor 50 also has a source terminal connected to the bulk terminal).

The switching logic stage 40 includes a MOS latch 54 having the input terminals N1, N2 as input/output terminals and referred to the internal node S. This switching logic stage 40 is formed by a first and a second latch transistor 55, 56, in cross-configuration, wherein:

the first latch transistor 55, of low-voltage nMOS-type, has its drain terminal connected to the input terminal N1 of the load stage 30 (having the first driving signal drv_on), source terminal connected to the internal node S and gate terminal connected to the input terminal N2 of the switching logic stage 40 (and to the drain terminal of the second latch transistor 56); and the second latch transistor 56, of low-voltage nMOS-type, has its drain terminal connected to the input terminal N2 of the switching logic stage 40, source terminal connected to the internal node S and gate terminal connected to the input terminal N1 of the load stage 30 (and to the drain terminal of the first latch transistor 55).

The aforementioned latch transistors 55, 56 also have source terminal connected to the corresponding bulk terminal.

The switching logic stage 40 further includes a zener diode 58, having anode connected to the internal node S and cathode connected to the input terminal N2 (and to the gate terminal of the first latch transistor 55 and drain terminal of the second latch transistor 56).

As will also be highlighted hereinbelow, the MOS latch 54, referred to the internal node S, allows to speed up switching from the on-state to the off-state (and vice versa) and to maintain the aforementioned on- and off-states of the bidirectional switch 21 with a minimum current request.

During operation, also referring to FIG. 4A (which highlights the portion of the switch device 20 referred to the turn-on state) and also to the timing diagrams of FIG. 4B, a pulse of turn-on current $I_{ON}$ at a first precharge value determines generation, by the load stage 30, of the driving signal drv_on, for turning on the driving transistor $M_{ON}$ of the driving stage 26 (and turning on the bidirectional switch 21).

In particular, in the embodiment described, the value of the driving signal drv_on, referred to the internal node S, is given by the sum of the voltage $V_{ZD}$ on the load zener diode 52 and the gate-source voltage $V_{GS}(\mathbf{50})$ of the load transistor 50 (diode-connected):

$$V(\text{drv\_on}) = V_{ZD} + V_{GS}(50).$$

The driving transistor $M_{ON}$ of the driving stage 26 turns on with a gate-source voltage $V_{GS}(M_{ON})$ substantially equal to $V_{ZD}$, assuming that the same driving transistor $M_{ON}$ is matched to the load transistor 50 (it should be noted that, to optimize this matching, the load transistor 50 may be implemented as a high-voltage transistor, with a minimum penalty in terms of power and area consumption).

The second latch transistor 56 also turns on, thus bringing the second driving signal drv_off to the value of the internal node S and thereby turning off the switching transistor $M_{OFF}$ (and also the first latch transistor 55).

Advantageously, the turn-on time of the bidirectional switch 21 is very fast, thanks in particular to the source-follower configuration of the driving transistor $M_{ON}$ and to the small charge which needs to be provided to charge the parasitic capacitances. The turn-on current $I_{ON}$ depends on the size of the same driving transistor $M_{ON}$ and may be easily optimized with respect to the parasitic capacitances to be charged. Furthermore, the turn-on current $I_{ON}$ which is provided in excess (in any case for a limited time, determined by the precharge pulse) is "recycled" on the capacitive elements (for example load and storage elements) connected to the first and second switch terminals A and T of the bidirectional switch 21.

Subsequently, the turn-on condition may be maintained for a second value of the turn-on current $I_{ON}$, being a holding value, lower than the aforementioned first precharge value (as shown in the aforementioned FIG. 4B), exploiting the positive feedback offered by the MOS latch 54. This holding current is sufficient to reinforce the positive feedback offered by the MOS latch 54 to compensate for parasitic effects (couplings, ground and reference movements) which might lead to an improper switching of the same latch.

Figure 5A:
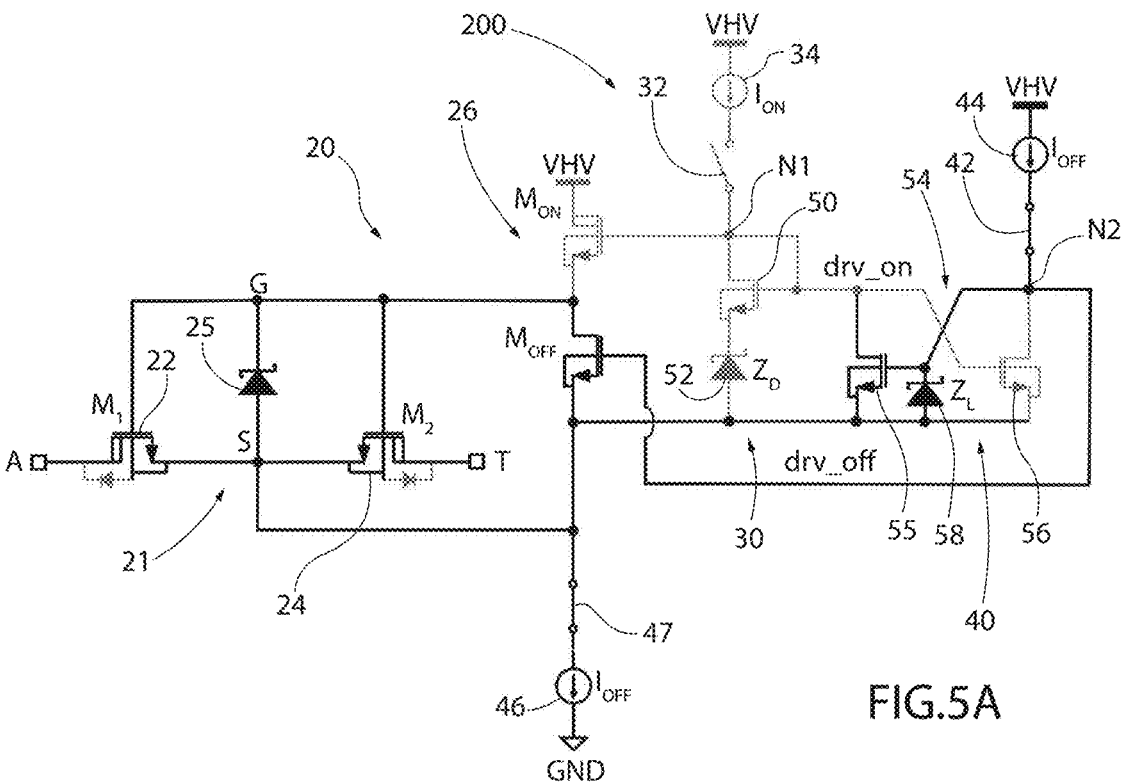
FIG. 5A shows the bidirectional switch device of FIG. 3, with particular reference to a turn-off phase.
Figure 5B:
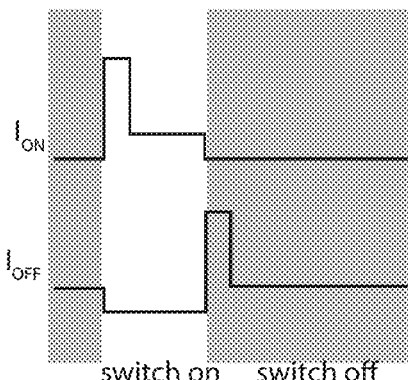
FIG. 5B shows a time diagram of turn-on and turn-off currents in the switch device, with particular reference to the aforementioned turn-off phase.

Referring now to FIG. 5A (which highlights the portion of the switch device 20 referred to the turn-off state) and to the timing diagrams of FIG. 5B, the turn-off phase of the bidirectional switch 21 envisages removal of the turn-on current $I_{ON}$ (which goes to a null value) and the provision of the turn-off current $I_{OFF}$, having a respective pulse at a first precharge value (followed by a holding value, lower than the aforementioned first value, which is maintained throughout the entire duration of the turn-off phase).

Following the provision of the aforementioned turn-off current $I_{OFF}$, the second driving signal drv_off increases with respect to the internal node S up to a value $V_{ZL}$, equal to the voltage across the zener diode 58.

Consequently, the switching transistor $M_{OFF}$ turns on, with a voltage between the corresponding gate and source terminals $V_{GS}(M_{OFF})$ equal to the same value $V_{ZL}$. Furthermore, the first latch transistor 55 turns on, to bring the first driving signal drv_on to the value of the internal node S and thereby turn off the driving transistor $M_{ON}$.

Given that, typically, the turn-off state has a longer duration with respect to the turn-on state, it may also be envisaged that a current matched to the aforementioned turn-off current $I_{OFF}$ is extracted from the internal node S by the further turn-off current generator 46 (with the third switch 47 closed), in such a way as to compensate for the current utilized to maintain the state of the MOS latch 54 and not influence the voltage values present at the first and the second switch terminals A, T of the bidirectional switch 21.

Figure 6:
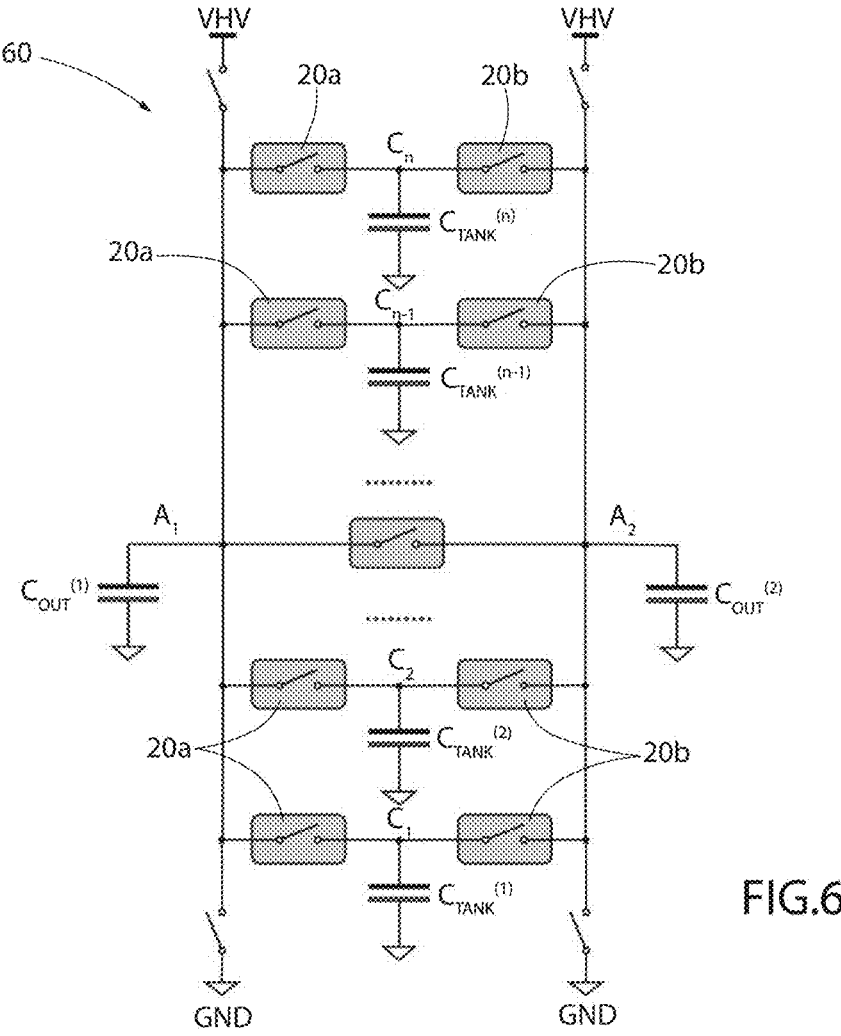
FIG. 6 shows a schematic circuit diagram of a charge recovery resonant driver wherein the switch device may be used, according to a further aspect of the present solution.

With reference to FIG. 6, a possible application of the aforementioned switch device 20 is now described, in a charge recovery resonant driver, generally indicated by 60.

This resonant driver 60 operates to exchange electric charge between a first capacitive actuator $C_{OUT(1)}$, coupled to a first charge exchange terminal A1, which is selectively alternately connectable to a supply terminal having a high-voltage VHV and a ground reference terminal GND; and a second capacitive actuator $C_{OUT(2)}$, coupled to a second charge exchange terminal A2, which is also selectively alternately connectable to the supply terminal having the high voltage VHV and the ground reference terminal GND.

The resonant driver 60 includes a plurality N of tank capacitors, indicated by $C_{TANK}(1)$ .... $C_{TANK}(N)$, which may be selectively connected to the first or the second charge exchange terminal A1, A2, by a first switch device 20a, respectively by a second switch device 20b (coupled to each other at a respective internal node $C_1$ .... $C_N$, having the respective tank capacitors $C_{TANK}(1)$ .... $C_{TANK}(N)$ connected thereto).

In particular, each of the aforementioned first and second switch devices 20a, 20b may advantageously be formed as previously described in detail for the switch device 20.

Advantageously, the floating condition, in turn-off state, of both the first switch element 22 and the second switch element 24 of each switch device 20 causes the gate and source terminals of the corresponding MOS transistors M1 and M2 to follow the trend of the switch terminals A and T to maintain a bias condition always close to that of the (next) turn-on. In terms of charge, this means that the parasitic capacitances of the switches "participate" in the charge redistribution (significantly reducing the lost charge). The advantage of the proposed solution is therefore twofold: no charge is lost by continuing to charge and discharge the parasitic capacitances, and the switch is made to be close, before turning on, to the bias condition that it will have during the same turn-on, thus minimizing turn-on time.

Figure 7:
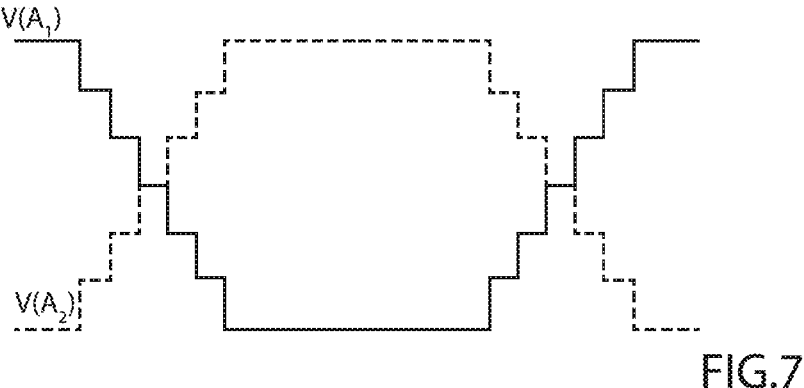
FIG. 7 shows voltage diagrams relating to operation of the driver of FIG. 6.

By suitably driving the aforementioned first and second switch devices 20a, 20b it is possible, in a per se known manner, not described in detail herein, to obtain a step increase, corresponding decrease, of the voltages $V(A_1)$, $V(A_2)$ present on the aforementioned first and second charge exchange terminals $A_1$, $A_2$, as shown schematically in FIG. 7.

In particular, it has been demonstrated that the power consumption associated with the resonant driver 60 is reduced by a theoretical factor N (being equal to $$2 \cdot C_{OUT} \cdot V_{HV}^2 \cdot f/N),$$

where N coincides with the number of intermediate levels generated on the rising and falling edges (the same number N coinciding with the number of the aforementioned tank capacitors).

However, this factor N is generally reduced by the power consumption utilized for driving the switch devices 20a, 20b.

The present Applicant has instead demonstrated the possibility of substantially reaching the ideal value for the aforementioned factor N thanks to the use of the solution previously described in detail for providing the aforementioned switch devices 20a, 20b, thanks to the possibility of minimizing the loss of charge associated with the turn-on of the switch devices and to the possibility of speeding up turn on and turn off of the same switch devices.

Figure 8:
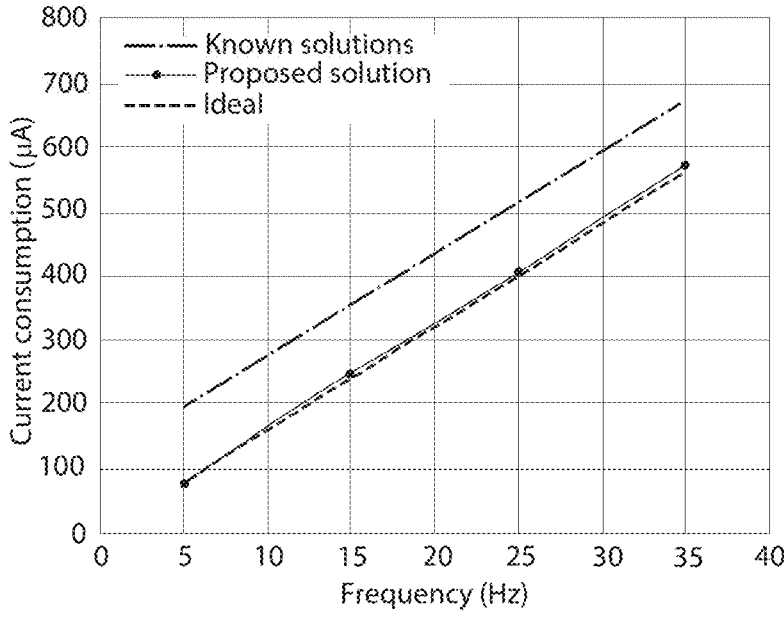
FIG. 8 shows the trend of a current consumption as a function of frequency in the driver of FIG. 6, compared with known-type solutions.

In this regard, FIG. 8 shows the trend of the current consumption associated with the resonant driver 60, by way of example as a function of the frequency f (assuming that the high voltage VHV is equal to 32 V, the capacitance, here indicated by $C_{LOAD}$, of the first and the second capacitive actuators is equal to 2 nF and the number N of tank capacitors is equal to 8).

Figure 1:
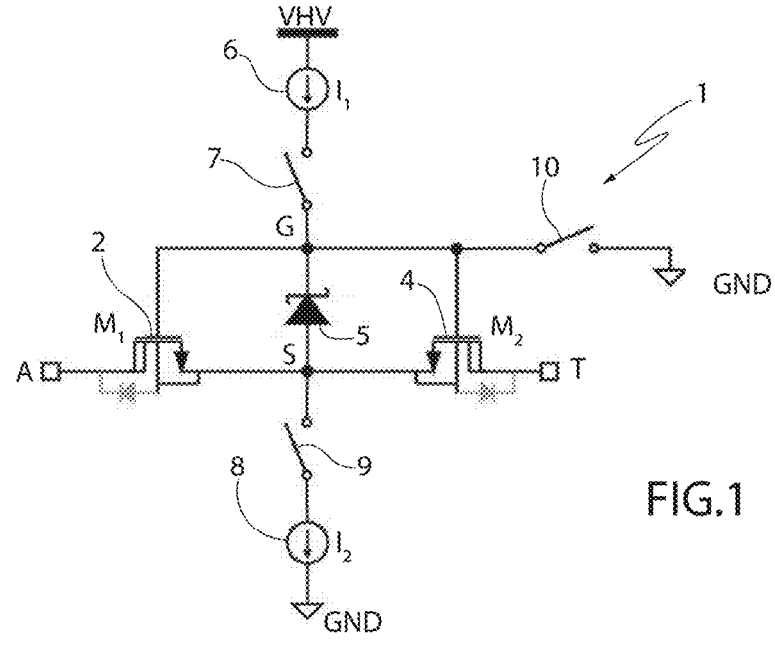
FIG. 1 shows the circuit diagram of a high-voltage bidirectional switch device, of a known type.

In particular, the ideal current consumption (equal to $2 \cdot C_{OUT} \cdot V_{HV} \cdot f/N$) is indicated in dashed line; the current consumption obtainable with a solution of known-type (wherein switch devices of traditional type are used, for example of the type shown in FIG. 1) are indicated in dash-dot line; and the current consumption obtainable using the switch devices 20 according to the present solution is indicated in solid line.

It is therefore clear that the solution described for the aforementioned switch devices 20 allows to achieve a current consumption substantially equivalent to the ideal consumption.

The advantages of the proposed solution are clear from the preceding description.

In any case, it is highlighted that the solution described for the switch device 20 allows to obtain a rapid turn-on time, thanks in particular to the fact that the parasitic capacitances are not completely discharged during the turn-off phase and also thanks to the fact that the driving current is provided to the bidirectional switch 21 by an n-type MOS in source-follower configuration (the aforementioned driving transistor $M_{ON}$).

Furthermore, the turn-off time is also rapid, thanks to the fact that the turn-off condition is obtained by zeroing the voltage between the gate and source terminals of the MOS transistors M1, M2, instead of bringing the corresponding gate terminals to ground.

At the same time, given the efficiency in controlling the parasitic capacitances, the size of the MOS transistors M1 and M2 may possibly be increased, to reduce the on-state resistance (without excessively penalizing the turn-on time).

The described solution also allows an improvement in power consumption and efficiency, in particular thanks to the fact that the complete discharge of the parasitic capacitances to the ground reference GND is avoided, at each switching from the on-state to the off-state of the switch device.

The solution described also has a reduced complexity and area occupation compared to known-type solutions.

Finally, it is clear that modifications and variations may be made to what has been described and illustrated herein without thereby departing from the scope of the present invention, as defined in the attached claims.

In particular, it is emphasized that different circuit implementations may be envisaged for both the load stage 30 and for the switching logic stage 40 of the switch device 20.

Figure 9:
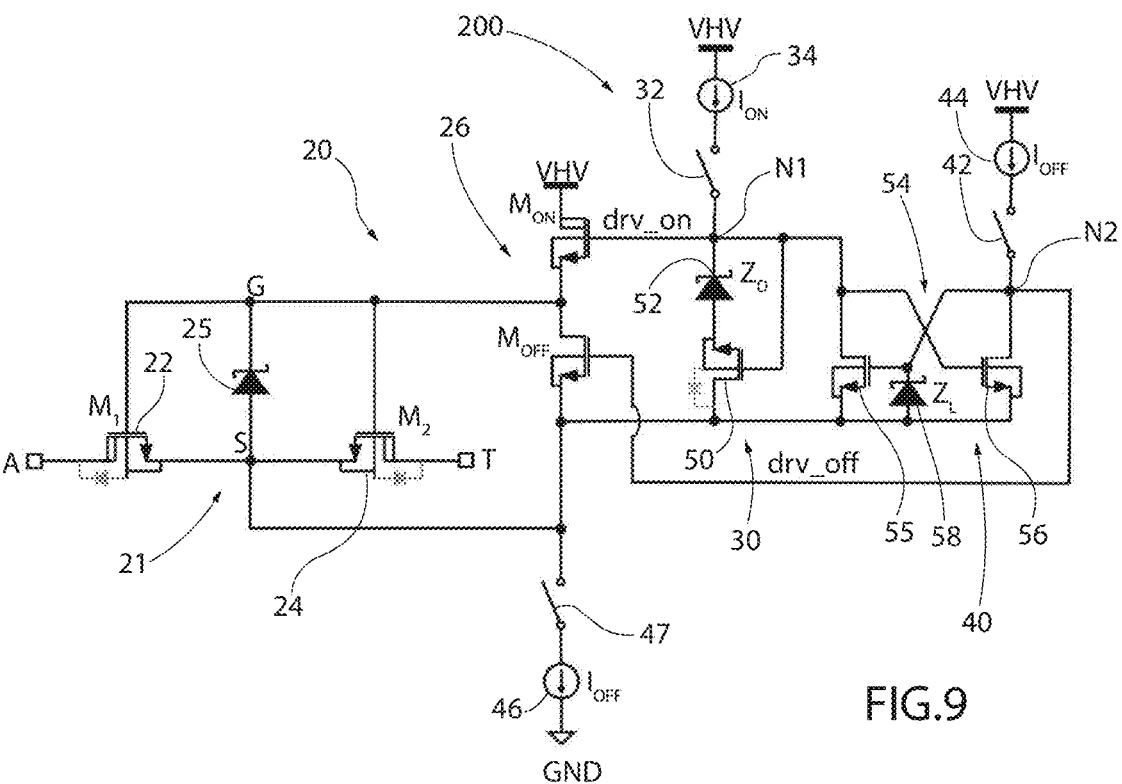
FIGS. 9-10 show respective circuit diagrams of the bidirectional switch device, in accordance with a different embodiment of the present solution.

For example, FIG. 9 shows the switch device 20 wherein a different implementation is adopted for the aforementioned load stage 30.

In this embodiment, this load stage 30 includes the load zener diode 52, this time having its cathode terminal connected to the input terminal N1 of the load stage 30 and anode terminal connected to the source terminal of the load transistor 50.

The aforementioned load transistor 50, also in this case of low-voltage NMOS-type, also has gate terminal connected to the input terminal N1 of the load stage 30 and drain terminal connected to the internal node S.

In turn-on condition, the load transistor 50 operates in this case in linear region, adding a small voltage drop to the voltage drop on the load zener diode 52, for generating the first driving signal drv_on.

An advantage represented by this embodiment is that of avoiding the possibility of establishing a direct current path between the internal node S and the supply terminal.

This embodiment may, for example, be advantageous in case the switch device 20 is used as an anti-ringing switch to short-circuit a corresponding inductance in a DC-DC converter (according to a known solution, not described in detail herein).

Figure 10:
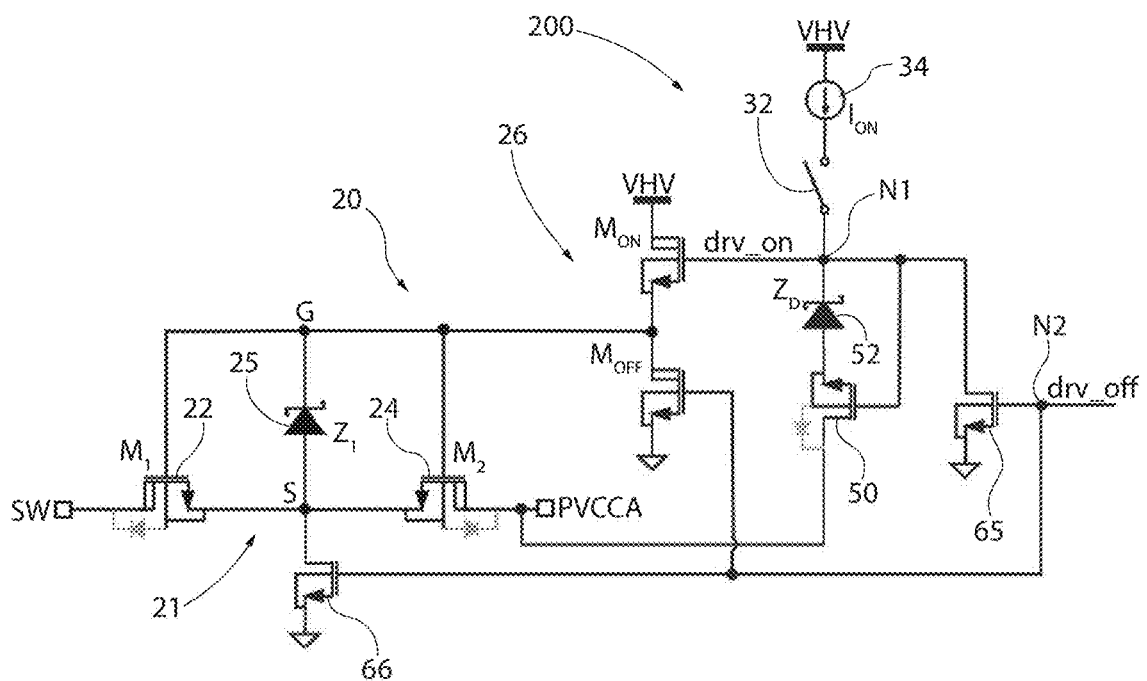

In this regard, FIG. 10 shows how the control and driving stage 200 of the switch device 20 might be modified (simplified) for this specific application.

In particular, the switch terminal T is in this case connected to a positive power source PVCCA of the DC-DC converter, while the switch terminal A is connected to a switching node SW.

The switching logic stage 40 may be simplified by the presence of a single low-voltage nMOS-type transistor, indicated by 65, which has its drain terminal connected to the input terminal N1 of the load stage 30 (having the first driving signal drv_on), source terminal connected to the ground reference GND and gate terminal connected to the input terminal N2 of the switching logic stage 40 and receiving in this case the second driving signal drv_off. A further low-voltage nMOS-type transistor, indicated by 66, is connected between the internal node S and the same ground reference GND and has its gate terminal connected to the input terminal N2.

In this case, the switch device 20 turns on with respect to the positive power source PVCCA and may be turned off at the ground reference GND. As previously indicated, the presence of the load zener diode 52 in series with the load transistor 50 avoids a direct current path in turn-off state between the same positive power source PVCCA and the ground reference GND.

A further implementation of the same load stage 30 might also envisage the absence of the load transistor 50, in this case the value of the first driving signal drv_on being a function of the sole voltage drop on the load zener diode 52. In this case, a greater SoA (Safe Operating Area) might be obtained, at the expense of a lower switching speed.

In general, the same load stage 30 might be implemented with further different embodiments, for example with one or more series-connected resistors, with one or more diode-connected MOS transistors, or with other different implementations.

In one embodiment, a switch device (20), includes a bidirectional switch (21), formed by: a first switch MOS transistor (22), having its drain terminal connected to a first switch terminal (A), source terminal connected to an internal source node(S) and gate terminal connected to an internal gate node (G); a second switch MOS transistor (24), having its drain terminal connected to a second switch terminal (T), source terminal connected to the internal source node(S) and gate terminal connected to the internal gate node (G); and a voltage limiting element (25) connected between the internal gate and source nodes (G, S), wherein the switch device (20) further includes a driving stage (26), voltage-referred to the internal source node(S) and configured to drive switching of the bidirectional switch (21), as a function of a first and a second driving signals (drv_on, drv_off), the driving stage (26) including a driving transistor ($M_{ON}$) and a switching transistor ($M_{OFF}$) connected to each other in inverter configuration; wherein the driving transistor ($M_{ON}$) is connected to a supply terminal and is driven by the first driving signal (drv_on) to charge the internal gate node (G) and turn on the bidirectional switch (21) in a turn-on interval of the switch device (20); and the switching transistor ($M_{OFF}$) is driven by the second driving signal (drv_off) to short-circuit the internal gate and source nodes and turn off the bidirectional switch (21) in a turn-off interval of the switch device (20).

The driving transistor ($M_{ON}$) may be an n-type MOS transistor in source-follower configuration.

The driving transistor ($M_{ON}$) may have its drain terminal connected to the supply terminal, gate terminal receiving the first driving signal (drv_on) and source terminal connected to the aforementioned internal gate node (G); and the switching transistor ($M_{OFF}$) may have its drain terminal connected to the internal gate node (G), gate terminal receiving the second driving signal (drv_off) and source terminal connected to the internal source node(S).

During the turn-off interval of the switch device (20), the first and second switch MOS transistors (22, 24) of the bidirectional switch (21) may be in a floating state.

The device may further include a load stage (30), voltage-referred to the internal source node(S) and having an input terminal (N1) selectively connectable, by a first switch (32) to a turn-on current generator (34), configured to generate a turn-on current ($I_{ON}$); wherein the load stage (30) may be configured to generate, through the turn-on current ($I_{ON}$), the first driving signal (drv_on), being a voltage signal, for causing turn-on of the driving transistor ($M_{ON}$) of the driving stage (26).

The load stage (30) may include a load transistor (50) and a load zener diode (52), connected in series with the load transistor (50), having anode terminal connected to the internal source node(S) and cathode terminal connected to the source terminal of the load transistor (50); the load transistor (50) having its gate terminal connected to the corresponding drain terminal, being therefore diode-connected, and also to the input terminal (N1) of the load stage (30).

The load stage (30) may include a load transistor (50) and a load zener diode (52), having its cathode terminal connected to the input terminal (N1) of the load stage (30) and anode terminal connected to the source terminal of the load transistor (50); wherein the load transistor (50) may have its gate terminal connected to the input terminal (N1) of the load stage (30) and drain terminal connected to the internal source node(S).

The load transistor (50) may be of a low-voltage NMOS-type.

The device may further include a switching logic stage (40), voltage-referred to the internal source node(S) and having a respective input terminal (N2) selectively connectable, by a second switch (42), to a turn-off current generator (44), configured to generate a turn-off current ($I_{OFF}$); wherein the switching logic stage (40) may be configured to generate, based on the turn-off current ($I_{OFF}$) and the value of the first driving signal (drv_on), the second driving signal (drv_off), being a voltage signal, for causing turn-on of the switching transistor ($M_{OFF}$) of the driving stage (26).

The second driving signal (drv_off), with a high logic value, may be designed to turn on the switching transistor ($M_{OFF}$) and may be generated based on the turn-off current ($I_{OFF}$) and the switching to a low logic value of the first driving signal (drv_on), generated by turning-off of the turn-on current ($I_{ON}$); the first and second driving signals (drv_on, drv_off), for determining switching on/off of the turn-on and switching transistors ($M_{ON}$, $M_{OFF}$), thus being controlled through the turn-on and turn-off currents ($I_{ON}$, $I_{OFF}$), in turn determined by the activation, logically alternative, of the corresponding first and second switches (32, 42).

The switching logic stage (40) may include a MOS latch (54) having the input terminals (N1, N2) as input/output terminals and referred to the internal source node(S); the MOS latch (54) being formed by a first and a second latch transistors (55, 56), in cross-configuration, connected between the respective input terminal (N2) and the internal source node(S); and a zener diode (58), having its anode connected to the internal source node(S) and cathode connected to the respective input terminal (N2).

The MOS latch (54) may include: a first latch transistor (55), having its drain terminal connected to the load stage (30) and on which the first driving signal (drv_on) is present, source terminal connected to the internal source node(S) and gate terminal connected to the respective input terminal (N2) of the switching logic stage (40); and a second latch transistor (56), having its drain terminal connected to the respective input terminal (N2) of the switching logic stage (40), source terminal connected to the internal source node(S) and gate terminal connected to the drain terminal of the first latch transistor (55).

The first and second latch transistors (55, 56) may be low-voltage nMOS-type transistors.

The device may further include a further turn-off current generator (46), configured to generate the turn-off current ($I_{OFF}$) and selectively connected between the internal source node(S), by a third switch (47), and a ground reference (GND).

The switching logic stage (40) may include a low-voltage nMOS transistor (65), having its drain terminal connected to the input terminal (N1) of the load stage (30), source terminal connected to a ground reference (GND) and gate terminal connected to the respective input terminal (N2) of the switching logic stage (40) and receiving the second driving signal (drv_off); wherein a further low-voltage nMOS transistor (66) may be connected between the internal source node(S) and the ground reference (GND) and may have its gate terminal connected to the respective input terminal (N2).

In one embodiment, a charge recovery resonant driver (60) may be summarized as being configured to exchange electric charge between a first capacitive actuator ($C_{OUT1}$), coupled to a first charge exchange terminal ($A_1$), selectively alternately connectable to a supply terminal having a high voltage (VHV) and a ground reference terminal (GND); and a second capacitive actuator ($C_{OUT2}$), coupled to a second charge exchange terminal ($A_2$), selectively alternately connectable to the supply terminal and the ground reference terminal (GND); the resonant driver (60) including a plurality (N) of tank capacitors ($C_{TANK}(1)$ . . . . $C_{TANK}(N)$), selectively connected to the first or the second charge exchange terminals ($A_1$, $A_2$), by a first switch device (20a), respectively by a second switch device (20b); wherein each of the first and second switch devices (20a, 20b) is implemented as the switch device (20).

In one embodiment, the first and second capacitive actuators ($C_{OUT1}$, $C_{OUT2}$) may be capacitive micromirrors.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A switch device, comprising:
a bidirectional switch including:
a first switch MOS transistor, having a drain terminal connected to a first switch terminal, a source terminal connected to an internal source node and a gate terminal connected to an internal gate node;
a second switch MOS transistor, having a drain terminal connected to a second switch terminal, a source terminal connected to the internal source node and a gate terminal connected to the internal gate node; and
a voltage limiting element connected between the internal gate and source nodes; and
a driving stage voltage-referred to the internal source node and configured to drive switching of the bidirectional switch as a function of a first driving signal and a second driving signal, the driving stage including a driving transistor and a switching transistor connected to each other;
wherein the driving transistor is connected to a supply terminal and is driven by the first driving signal to charge the internal gate node and turn on the bidirectional switch in a turn-on interval of the switch device; and
wherein the switching transistor is driven by the second driving signal to short-circuit the internal gate and source nodes and turn off the bidirectional switch in a turn-off interval of the switch device.

2. The device according to claim 1, wherein the driving transistor is an n-type MOS transistor in a source-follower configuration.

3. The device according to claim 2, wherein:
the driving transistor has a drain terminal connected to the supply terminal, a gate terminal receiving the first driving signal, and a source terminal connected to the internal gate node; and the switching transistor has a drain terminal connected to the internal gate node, a gate terminal receiving the second driving signal, and a source terminal connected to the internal source node.

4. The device according to claim 1, wherein during the turn-off interval of the switch device the first and second switch MOS transistors of the bidirectional switch are in a floating state.

5. The device according to claim 1, further comprising a load stage voltage-referred to the internal source node and having an input terminal selectively connectable by a first switch to a turn-on current generator configured to generate a turn-on current, wherein the load stage is configured to generate, through the turn-on current, the first driving signal for causing turn-on of the driving transistor of the driving stage, the first driving signal being a voltage signal.

6. The device according to claim 5, wherein the load stage includes a load transistor and a load zener diode connected in series with the load transistor and having an anode terminal connected to the internal source node and a cathode terminal connected to the source terminal of the load transistor, the load transistor having a gate terminal connected to a drain terminal of the load transistor and to the input terminal of the load stage.

7. The device according to claim 5, wherein the load stage includes a load transistor and a load zener diode having a cathode terminal connected to the input terminal of the load stage and an anode terminal connected to the source terminal of the load transistor, wherein the gate terminal of the load transistor is connected to the input terminal of the load stage and the drain terminal of the load transistor is connected to the internal source node.

8. The device according to claim 6, wherein the load transistor is of a low-voltage NMOS-type.

9. The device according to claim 5, further comprising a switching logic stage voltage-referred to the internal source node and having an input terminal selectively connectable, by a second switch, to a turn-off current generator configured to generate a turn-off current, wherein the switching logic stage is configured to generate, based on the turn-off current and the value of the first driving signal, the second driving signal for causing turn-on of the switching transistor of the driving stage, the second driving signal being a voltage signal.

10. The device according to claim 9, wherein the second driving signal, with a high logic value, is designed to turn on the switching transistor and is generated based on the turn-off current and the switching to a low logic value of the first driving signal, generated by turning-off of the turn-on current, the first and second driving signals for determining switching on/off of the turn-on and switching transistors thus being controlled through the turn-on and turn-off currents, in turn determined by the activation, logically alternative, of the corresponding first and second switches.

11. The device according to claim 9, wherein the switching logic stage comprises a MOS latch having the input terminals as input/output terminals and referred to the internal source node, the MOS latch being formed by a first and a second latch transistors, in cross-configuration, connected between the respective input terminal and the internal source node; and a zener diode, having its anode connected to the internal source node and cathode connected to the respective input terminal.

12. The device according to claim 11, wherein the MOS latch comprises:

a first latch transistor, having a drain terminal connected to the load stage and on which the first driving signal is present, a source terminal connected to the internal source node, and a gate terminal connected to the input terminal of the switching logic stage; and a second latch transistor, having a drain terminal connected to the respective input terminal of the switching logic stage, a source terminal connected to the internal source node, and a gate terminal connected to the drain terminal of the first latch transistor.

13. The device according to claim 12, wherein the first and second latch transistors are low-voltage nMOS-type transistors.

14. The device according to claim 9, further comprising a further turn-off current generator configured to generate the turn-off current and selectively connected between the internal source node by a third switch and a ground reference.

15. The device according to claim 9, wherein the switching logic stage comprises a low-voltage nMOS transistor, having a drain terminal connected to the input terminal of the load stage, a source terminal connected to a ground reference and a gate terminal connected to the respective input terminal of the switching logic stage and receiving the second driving signal, wherein a further low-voltage nMOS transistor is connected between the internal source node and the ground reference and having a gate terminal connected to the input terminal.

16. A charge recovery resonant driver, comprising:

a first capacitive actuator, coupled to a first charge exchange terminal selectively alternately connectable to a supply terminal having a high voltage and a ground reference terminal; and a second capacitive actuator, coupled to a second charge exchange terminal selectively alternately connectable to the supply terminal and the ground reference terminal;

a plurality of tank capacitors each coupled to a respective pair of devices and selectively connectable to the first charge exchange device by a first switch device of the pair and to the second charge exchange terminal by a second switch device of the pair, wherein each switch device includes a bidirectional switch including:

a first switch MOS transistor having a drain terminal connected to a first switch terminal, a source terminal connected to an internal source node, and a gate terminal connected to an internal gate node;

a second switch MOS transistor having a drain terminal connected to a second switch terminal, a source terminal connected to the internal source node and a gate terminal connected to the internal gate node; and a voltage limiting element connected between the internal gate and source nodes; and a driving stage voltage-referred to the internal source node and configured to drive switching of the bidirectional switch as a function of a first driving signal and a second driving signal, the driving stage including a driving transistor and a switching transistor connected to each other.

17. The charge recovery resonant driver of claim 16, wherein:

the driving transistor is connected to a supply terminal and is driven by the first driving signal to charge the internal gate node and turn on the bidirectional switch in a turn-on interval of the switch device; and the switching transistor is driven by the second driving signal to short-circuit the internal gate and source nodes and turn off the bidirectional switch in a turn-off interval of the switch device.

18. The charge recovery resonant driver according to claim 17, wherein the first and second capacitive actuators are capacitive micromirrors.

19. A method, comprising:

driving a bidirectional switch of a switch device with a driving stage based on a first driving signal and a second driving signal, the driving stage including a driving transistor and a switching transistor connected to each other, the bidirectional switch including a first switch MOS transistor and a second switch MOS transistor coupled together between a first switch terminal and a second switch terminal at an internal source node, an internal gate coupled to the internal source by a voltage limiting device, to gate terminals of the first and switch MOS transistors, and to an output of the driving stage;

providing a supply voltage to a drain terminal of the driving transistor;

charging the internal gate node and turning on the bidirectional switch in a turn-on interval of the switch device by driving the driving transistor with the first driving signal; and short-circuiting the internal gate and source nodes and turning off the bidirectional switch in a turn-off interval of the switch device by driving the switching transistor with the second driving signal.

20. The method of claim 19, wherein during the turn-off interval of the switch device the first and second switch MOS transistors of the bidirectional switch are in a floating state.

* * * * *